(12) United States Patent
Lin et al.

(10) Patent No.: US 8,569,846 B2
(45) Date of Patent: Oct. 29, 2013

(54) MOS DEVICES WITH IMPROVED SOURCE/DRAIN REGIONS WITH SIGE

(75) Inventors: Chun-Chieh Lin, Hsin-Chu (TW); Wei-Hua Hsu, Pan-Chiao (TW); Yu-En Percy Chang, Taipei (TW); Chung Li Chang, Hsin-Chu (TW); Chi-Feng Cheng, Hsin-Chu (TW); Win Hung, Hsin-Chu (TW); Kishimoto Ko, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/166,481

(22) Filed: Jun. 22, 2011

(65) Prior Publication Data

US 2011/0256681 A1    Oct. 20, 2011

Related U.S. Application Data

(63) Continuation of application No. 11/796,369, filed on Apr. 27, 2007, now Pat. No. 7,989,901.

(51) Int. Cl.
*H01L 29/78* (2006.01)

(52) U.S. Cl.
USPC ............ 257/408; 257/288; 257/E21.431; 438/300

(58) Field of Classification Search
USPC ............ 438/299–300; 257/680, 19, E21.431
See application file for complete search history.

(56) References Cited

U.S. PATENT DOCUMENTS

| | | | |
|---|---|---|---|
| 5,534,713 A | 7/1996 | Ismail et al. | |
| 6,846,715 B2 | 1/2005 | Fitzgerald et al. | |
| 6,885,084 B2 | 4/2005 | Murthy et al. | |
| 7,407,860 B2 | 8/2008 | Kim et al. | |
| 7,534,689 B2 * | 5/2009 | Pal et al. | 438/300 |
| 7,883,979 B2 * | 2/2011 | Chen et al. | 438/300 |
| 2003/0089901 A1 | 5/2003 | Fitzgerald | |
| 2006/0040503 A1 * | 2/2006 | Chang et al. | 438/722 |
| 2006/0073665 A1 | 4/2006 | Jain | |

(Continued)

FOREIGN PATENT DOCUMENTS

| CN | 101114673 A | 1/2008 |
|---|---|---|
| CN | 101578690 A | 11/2009 |

OTHER PUBLICATIONS

Kumagai, Y., et al., "Evaluation of Change in Drain Current Due to Strain in 0.13 -μm-node MOSFETs," Extended Abstracts of the 2002 International Conference on Solid State Devices and Materials, 2002, pp. 14-15, Nagoya.

Ray, S. K., et al., "Low Thermal Budget NiSi Films on SiGe Alloys," Materials Research Society Symposium Proceedings, vol. 745, 2003, pp. N6.6.1-N6.6.6.

(Continued)

*Primary Examiner* — Matthew W Such
*Assistant Examiner* — Ali Naraghi
(74) *Attorney, Agent, or Firm* — Slater & Matsil, L.L.P.

(57) ABSTRACT

A method includes forming a gate stack over a semiconductor substrate, and forming a first silicon germanium (SiGe) region in the semiconductor substrate and adjacent the gate stack. The first SiGe region has a first atomic percentage of germanium to germanium and silicon. A second SiGe region is formed over the first SiGe region. The second SiGe region has a second atomic percentage of germanium to germanium and silicon. The second atomic percentage is lower than the first atomic percentage, wherein the first and the second SiGe regions form a source/drain stressor of a metal-oxide-semiconductor (MOS) device.

11 Claims, 5 Drawing Sheets

(56) References Cited

U.S. PATENT DOCUMENTS

2006/0289856 A1* 12/2006 Shimamune et al. ........... 257/19
2007/0111421 A1* 5/2007 Cabral et al. ................. 438/199
2008/0023773 A1 1/2008 Shimamune et al.

OTHER PUBLICATIONS

Thompson, S. E., et al., "A Logic Nanotechnology Featuring Strained-Silicon," IEEE Electron Device Letters, vol. 25, No. 4, Apr. 2004, pp. 191-193.

* cited by examiner

MOS DEVICES WITH IMPROVED SOURCE/DRAIN REGIONS WITH SIGE

This application is a divisional of U.S. patent application Ser. No. 11/796,369, filed Apr. 27, 2007, and entitled "MOS Devices with Improved Source/Drain Regions with SiGe," which application is hereby incorporated herein by reference.

TECHNICAL FIELD

This invention relates generally to integrated circuits, and more particularly to structure and formation methods of MOS devices with silicon germanium regions.

BACKGROUND

The deep-submicron scaling required for VLSI systems dominates design considerations in the microelectronics industry. As the gate electrode length is scaled down, the source and drain junctions must be scaled down accordingly to suppress the so-called short channel effects (SCE) that degrade performance of miniaturized devices. A major problem related to complementary metal oxide silicon (CMOS) scaling is the undesirable increase in parasitic resistance. As the source/drain junction depth and polycrystalline silicon line width are scaled into the deep-submicron range, contact resistance becomes more significant and needs to be reduced.

The principle way of reducing contact resistances between polysilicon gates and source/drain regions and interconnect lines is by forming metal silicides atop the source/drain regions and the gate electrodes prior to the formation of various conductive interconnect lines. Silicide regions are typically formed by a self-aligned silicide (salicide) process. In the salicide process, a thin layer of metal is blanket deposited over the semiconductor substrate, specifically over exposed source/drain and gate electrode regions. The wafer is then subjected to one or more annealing steps. This annealing process causes the metal to selectively react with the exposed silicon of the source/drain regions and the gate electrodes, thereby forming metal silicide regions. The process is referred to as a self-aligned silicidation process because the silicide layer is formed only where the metal material directly contacts the silicon source/drain regions and the polycrystalline silicon (polysilicon) gate electrodes. Following the formation of the silicide regions, the un-reacted metal is removed and an interconnection formation process is performed to provide conductive paths. A typical interconnection formation process includes the step of forming via holes through a deposited interlayer dielectric and filling the via holes with a conductive material, e.g., tungsten.

Problems occur when the salicide processes are performed on PMOS devices, wherein their source/drain regions are often formed of SiGe. It is harder for silicon germanium than silicon to react with metal, and the roughness of germano-silicide is greater than the roughness of silicide. In addition, the sheet resistance of germano-silicide is significantly greater than the sheet resistance of silicide. This is particularly true if the salicide processes are performed at low temperatures, such as 600° C. or less. In order to reduce the sheet resistance and to reduce the profile of (germano-) silicide, new methods for improving the silicide formation process of MOS devices are needed.

SUMMARY OF THE INVENTION

In accordance with one embodiment, a method includes forming a gate stack over a semiconductor substrate, and forming a first silicon germanium (SiGe) region in the semiconductor substrate and adjacent the gate stack. The first SiGe region has a first atomic percentage of germanium to germanium and silicon. A second SiGe region is formed over the first SiGe region. The second SiGe region has a second atomic percentage of germanium to germanium and silicon. The second atomic percentage is lower than the first atomic percentage, wherein the first and the second SiGe regions form a source/drain stressor of a metal-oxide-semiconductor (MOS) device.

In accordance with another embodiment, a method includes forming a gate stack over a semiconductor substrate, and forming a dummy spacer on a sidewall of the gate stack. A recess is formed in the semiconductor substrate and adjacent the dummy spacer. A SiGe region is formed with at least a portion in the recess. The formation of the SiGe region includes epitaxially growing a first portion of the SiGe region in the recess and covering a bottom and a sidewall of the recess, wherein the first portion has a first atomic percentage of germanium to germanium and silicon, and epitaxially growing a second portion of the SiGe region in a remaining portion of the recess. The second portion has a second atomic percentage of germanium to germanium and silicon. The second atomic percentage is lower than the first atomic percentage. The method further includes removing the dummy spacer, forming a gate spacer on the sidewall of the gate stack, and reacting at least a top portion of the second portion of the SiGe region with a metal to form a silicide.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming silicon germanium (SiGe) regions in metal-oxide-semiconductor (MOS) devices is provided. The intermediate stages of manufacturing a preferred embodiment of the present invention are illustrated in FIGS. 1 through 9. Variations of the preferred embodiments are then discussed. Throughout the various views and illustrative embodiments of the present invention, like reference numbers are used to designate like elements.

Figure 1:
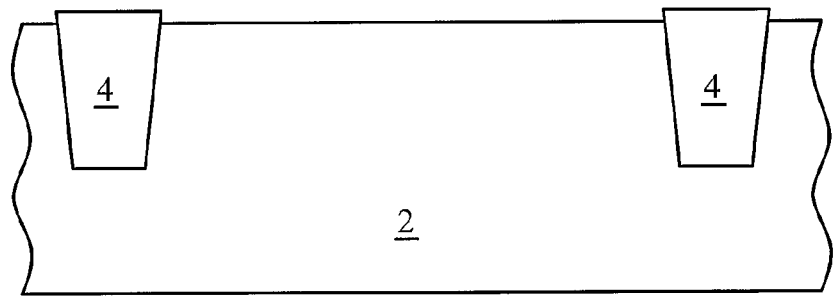
FIGS. 1 through 9 are cross-sectional views of intermediate stages in the manufacturing of a PMOS embodiment.

FIG. 1 illustrates the formation of shallow trench isolation (STI) regions 4 in substrate 2. In the preferred embodiment, substrate 2 comprises bulk silicon. In other embodiments, substrate 2 may have a composite structure, such as silicon-on-insulator (SOI). Shallow trench isolation (STI) regions 4 are formed to isolate device regions. As is known in the art, STI regions 4 may be formed by etching substrate 2 to form recesses, and then filling the recesses with dielectric materials, such as high-density plasma (HDP) oxides.

Figure 2:
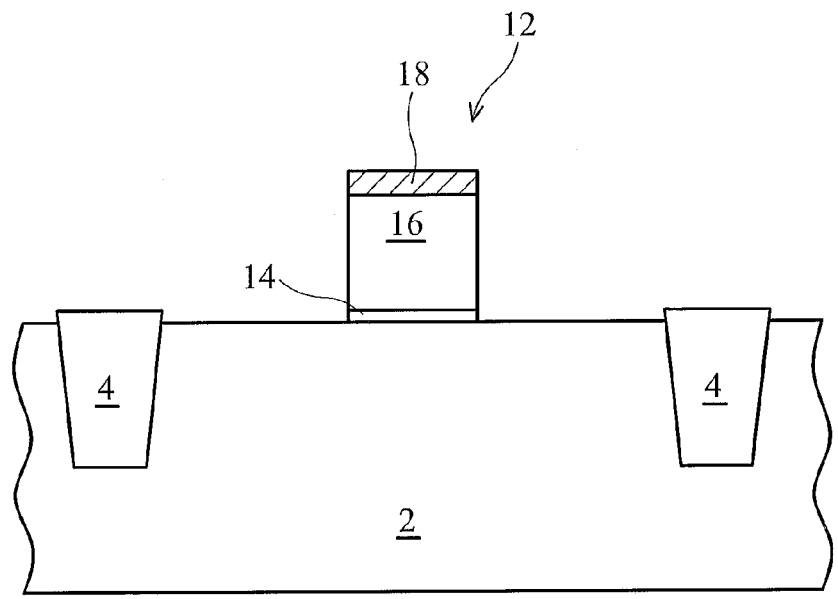

Referring to FIG. 2, a gate stack 12, which includes a gate dielectric 14, a gate electrode 16 and a hard mask 18, is formed on substrate 2. Gate dielectric 14 may be formed of commonly used dielectric materials such as oxides, nitrides, oxynitrides, multi-layers thereof, and combinations thereof. Gate electrode 16 may include commonly used materials such as doped polysilicon, metals, metal silicides, metal nitrides, and combinations thereof. Hard mask 18 preferably comprises silicon nitride, although other materials such as oxides, oxynitrides, and carbides can also be used. Gate dielectric 14, gate electrode 16 and hard mask 18 are preferably formed by depositing stacked layers including a gate dielectric layer, a gate electrode layer and a hard mask layer, and then patterning the stacked layers.

Figure 3:
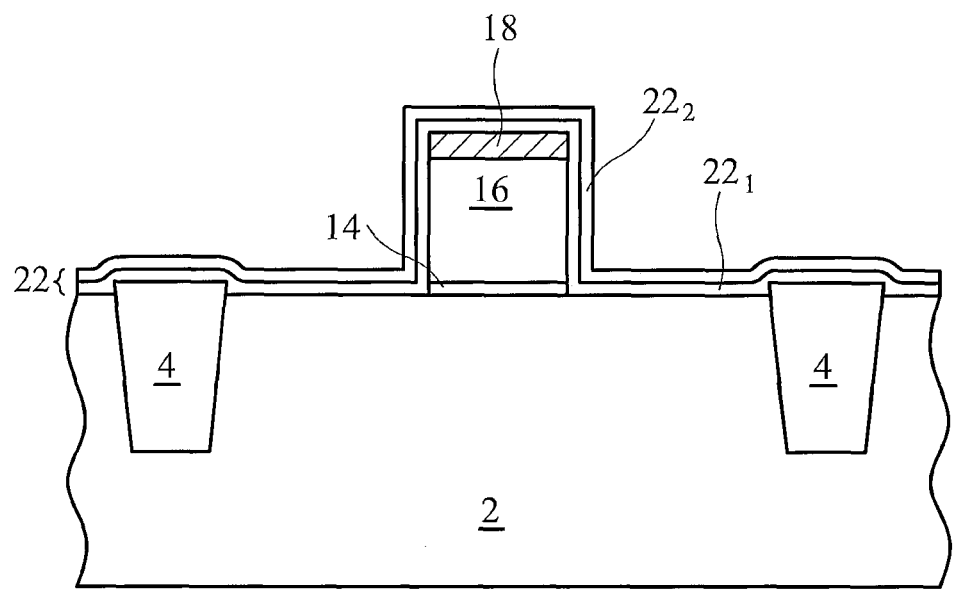

Referring to FIG. 3, a dummy spacer layer 22 is formed. In the preferred embodiment, dummy spacer layer 22 includes a liner oxide layer $22_1$ and a nitride layer $22_2$. In alternative embodiments, dummy spacer layer 22 may include one or more layers, each comprising oxides, silicon nitrides, silicon oxynitrides (SiON) and/or other dielectric materials. The preferred formation methods include commonly used deposition techniques, such as plasma enhanced chemical vapor deposition (PECVD), low-pressure chemical vapor deposition (LPCVD), sub-atmospheric chemical vapor deposition (SACVD), and the like.

Figure 4:
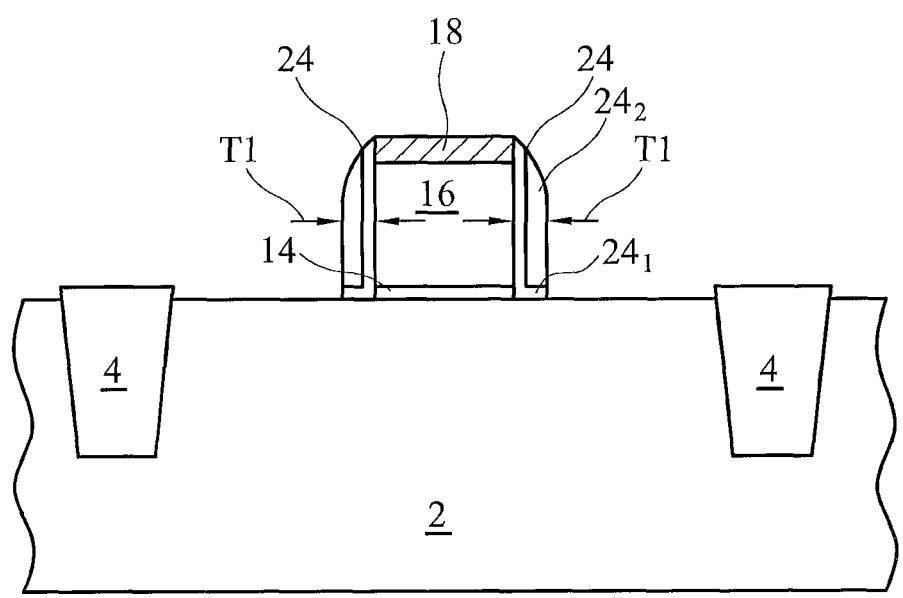

FIG. 4 illustrates the patterning of dummy spacer layer 22 to form dummy spacers 24, wherein the patterning may be performed by either wet etching or dry etching. The remaining portions of liner oxide layer $22_1$ and nitride layer $22_2$ form liner oxide portions $24_1$ and nitride portions $24_2$, respectively. Preferably, dummy spacers 24 are thin spacers having a thickness T1 of less than about 200Å, and more preferably between about 100Å and 200Å. Accordingly, dummy spacer layer 22 (refer to FIG. 3) is also thin.

Figure 5:
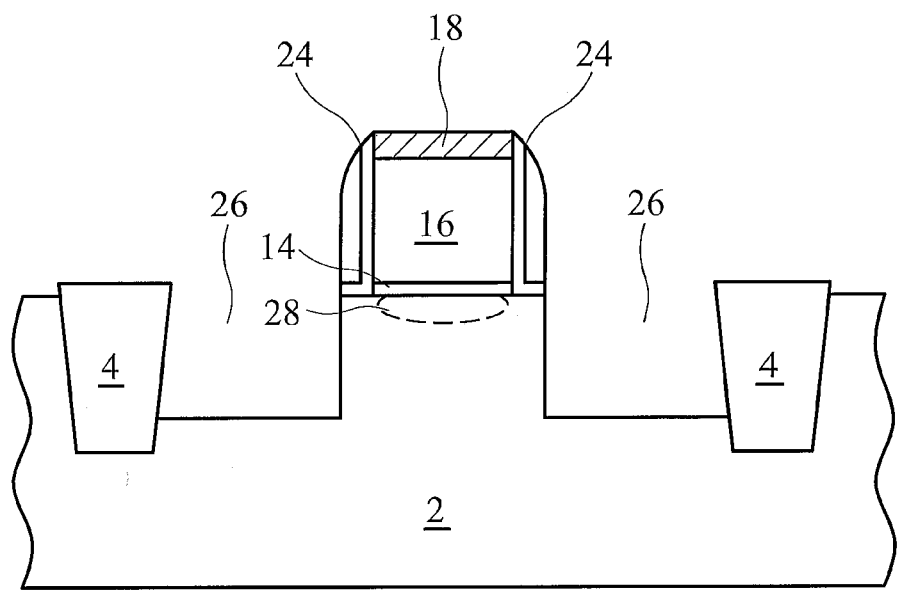

Referring to FIG. 5, recesses 26 are formed along the edges of dummy spacers 24, preferably by isotropically or anisotropically etching substrate 2. Dummy spacers 24 thus act as a protection layer for edges of gate electrode 16 and gate spacer 14. The preferred depth of recesses 26 is between about 500Å and about 1000Å, and more preferably between about 700Å and about 900Å, although the preferred depth will be scaled according to the scaling of the technology used for forming the integrated circuit. Since dummy spacers 24 are thin, recesses 26 are close to channel region 28.

Figure 6:
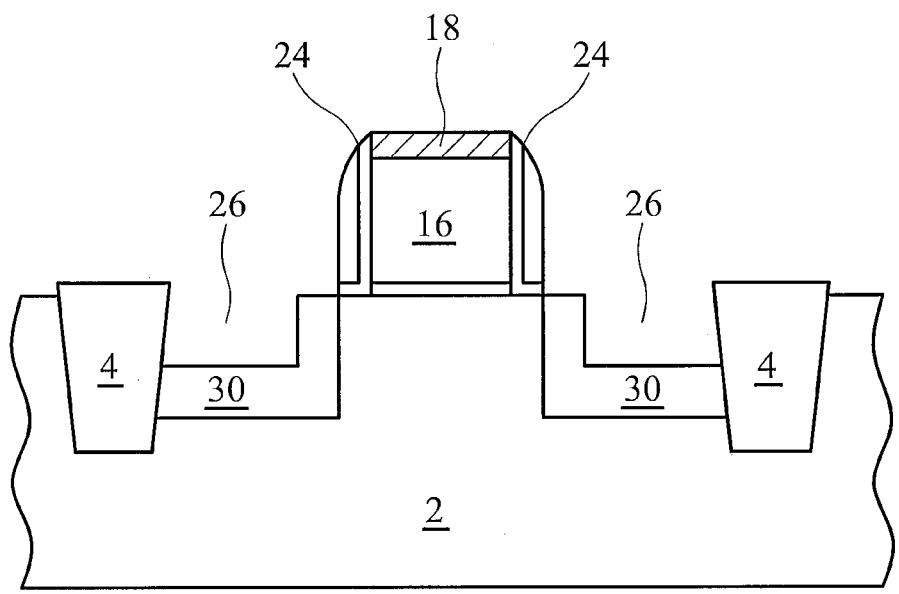

FIG. 6 illustrates the formation of epitaxy regions 30, preferably by selective epitaxial growth (SEG) in recesses 26. Epitaxy regions 30 are often referred to as SiGe stressors or SiGe regions. SiGe regions 30 preferably have a greater lattice spacing than a lattice spacing of substrate 2. In an exemplary embodiment, the SiGe epitaxy is performed using PECVD in a chamber, in which precursors containing Si and Ge, such as $SiH_4$ and $GeH_4$, are introduced. In an exemplary embodiment, the resulting SiGe regions 30 include between about 10 atomic percent and about 30 atomic percent germanium. Throughout the description, the germanium atomic percentage is used to refer to the percentage of germanium to germanium and silicon, while other elements such as impurities and metals are taken into account. In an exemplary embodiment, the atomic percentage of germanium is controlled by adjusting the partial pressures of $SiH_4$ and $GeH_4$. Optionally, p-type impurities are doped when the epitaxial growth of SiGe regions 30 proceeds.

Figure 7:
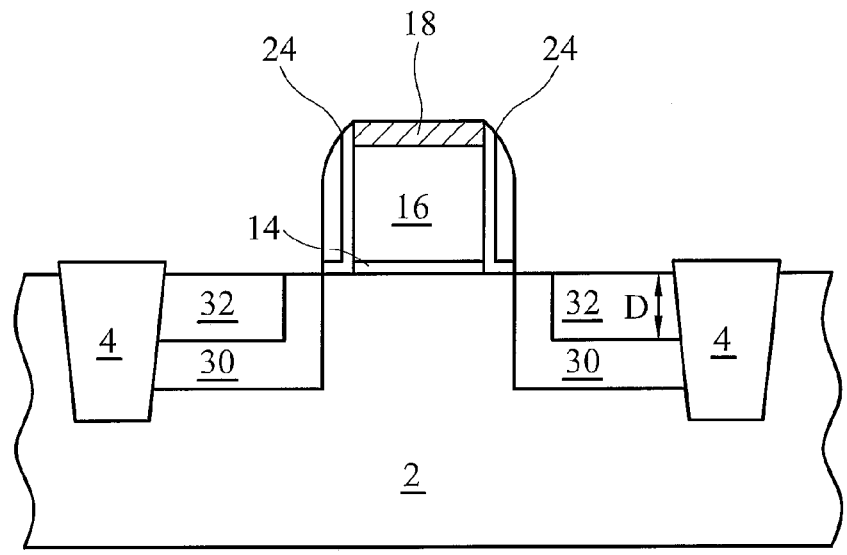

Referring to FIG. 7, the formation of SiGe regions 30 preferably stops before they completely fill recesses 26, and an additional SEG is performed to form epitaxial regions 32. The depth D of epitaxial regions 32 is preferably less than about 1000Å, and more preferably less than about 500Å, and even more preferably less than about 250Å. More preferably, depth D is substantially equal to a thickness of the portions to be consumed by the subsequent silicidation processes. In the preferred embodiment, epitaxial regions 32 comprise silicon with substantially no germanium. This may be achieved by turning off the flow of germanium-containing precursors, such as $SiGe_4$, and continuing the epitaxial growth of silicon. The formation of epitaxial regions 32 is preferably performed in-situ with the formation of SiGe regions 30.

In alternative embodiments, epitaxial regions 32 comprise SiGe. However, epitaxial regions 32 have a smaller germanium atomic percentage than SiGe regions 30. Preferably, the formation of epitaxial regions 32 is performed in-situ with the formation of SiGe regions 30. In an exemplary formation process, the partial pressure of germanium-containing precursors is reduced, which can be performed by reducing the flow rate of germanium-containing precursors. The germanium atomic percentage in the resulting epitaxy regions 32 is also preferably lower than the germanium atomic percentage in SiGe regions 30. More preferably, the germanium atomic percentage in SiGe regions 30 is greater than the germanium atomic percentage in epitaxial regions 32 by greater than about five atomic percent.

Figure 8:
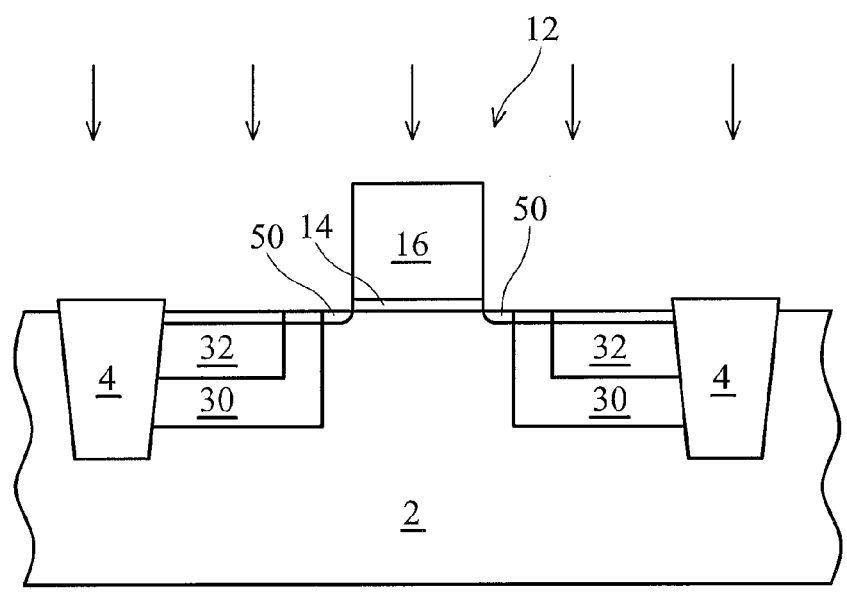

Referring to FIG. 8, dummy spacers 24 and hard mask 18 are removed. Preferably, hard mask 18 and the silicon nitride portions of dummy spacers 24 are removed by etching in phosphoric acid, and the liner oxide portions of dummy spacers 24 are stripped using diluted hydrofluoric acid.

Lightly doped source/drain (LDD) regions 50 are then formed, preferably by implanting a p-type impurity. Gate stack 12 acts as a mask so that LDD regions 50 are substantially aligned with the respective edges of gate stack 12. Halo/pocket regions (not shown) are also formed, preferably by implanting n-type impurities.

Figure 9:
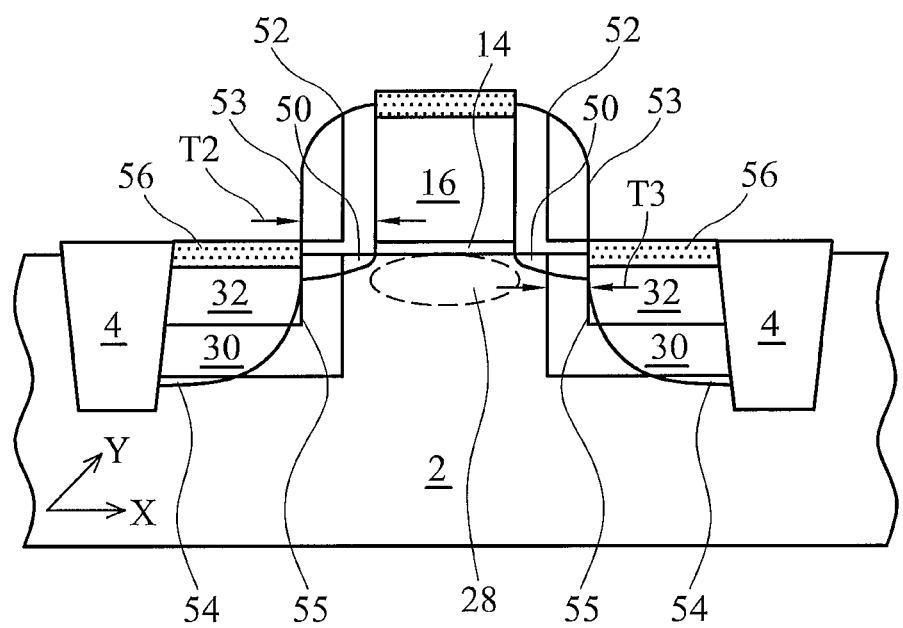

In FIG. 9, spacers 52 are formed. As is known in the art, spacers 52 may be formed by forming a liner oxide layer and a nitride layer on the liner layer, and then patterning the liner oxide layer and the nitride layer.

Deep source/drain regions 54 are then formed, preferably by implanting p-type impurities such boron, indium, and the like. FIG. 9 also illustrates the formation of silicide regions 56. As is known in the art, silicide regions 56 can be formed by depositing a thin layer of metal (not shown), such as titanium, cobalt, nickel, tungsten, or the like, over the devices, including the exposed surfaces of epitaxial regions 32 and gate electrode 16. The substrate is then heated, causing a silicidation to occur wherever the metal is in contact with silicon. After the reaction, a layer of metal silicide is formed between silicon and metal. The un-reacted metal is then selectively removed. In the preferred embodiment, the silicidation process substantially consumes the epitaxial regions 32, while substantially no SiGe regions 30 are consumed. In alternative embodiments, the silicidation process consumes not only the epitaxial regions 32, but also small portions of SiGe regions 30. In yet other embodiments, small bottom portions of epitaxial regions 32 are left, as are shown in FIG. 9. In such embodiments, the thickness of the remaining portions of epitaxial regions 32 is preferably less than about 100Å.

By limiting the silicidation process in Si regions, or in SiGe regions with a low germanium atomic percentage, the resulting silicide (or germano-silicide) regions 56 have a low sheet resistance. Metals tend to form silicides more easily with silicon than with germanium, thus the silicidation process is expedited, and the thermal budget can be reduced. Throughout the description, germano-silicide regions 56 are referred to as silicide regions although it may comprise germanium.

In the preferred embodiment, spacers 52 have a thickness T2 greater than a thickness T1 of dummy spacers 24 (refer to FIG. 4), although thickness T2 may be equal to or smaller than thickness T1. More preferably, outer edges 53 of spacers 52 are substantially aligned to edges 55 of epitaxial regions 32. The reason for having such a preference is that in order to apply a great stress to channel region 28, SiGe regions 30 preferably have a great thickness T3. On the other hand, to form silicide regions with as low sheet resistance as possible, the silicided portions of source/drain regions preferably have a low germanium concentration (or no germanium). Therefore, it is preferred that silicide regions are formed only on regions having low germanium concentrations.

The previously discussed embodiment illustrates the formation of SiGe regions by using dummy spacers. Alternatively, SiGe regions can be formed without forming dummy spacers. In an exemplary embodiment, the formation process includes forming a gate stack, forming LDD regions and halo/pocket regions, forming gate spacers, recessing the substrate to form recesses, growing composite SiGe regions in the recesses, wherein the composite SiGe regions comprise a low-germanium layer on a high-germanium layer, doping deep source/drain regions, and forming silicide regions on the low-germanium layer.

The concept of the preferred embodiments of the present invention may be applied to the simultaneous formation of PMOS and NMOS devices. The NMOS devices preferably have similar structures as shown in FIG. 9, except that source/drain regions of NMOS devices are doped with n-type impurities. The stressors of NMOS devices may be formed simultaneously with the formation of stressors of PMOS devices. As is known in the art, a compressive stress in channel length direction (X-direction in FIG. 9) improves drive currents of PMOS devices while degrades drive currents of NMOS devices. A tensile stress applied in channel width direction (Y-direction in FIG. 9) improves both NMOS devices and PMOS devices. Therefore, although the net effects of SiGe regions in NMOS devices are still detrimental, due to the formation of epitaxial regions 32, the detrimental effects are reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
    forming a gate stack over a semiconductor substrate;
    forming a first silicon germanium (SiGe) region in the semiconductor substrate and adjacent the gate stack, wherein the first SiGe region has a first atomic percentage of germanium to germanium and silicon;
    forming a second SiGe region over the first SiGe region, wherein the second SiGe region has a second atomic percentage of germanium to germanium and silicon, wherein the second atomic percentage is lower than the first atomic percentage, and wherein the first and the second SiGe regions form a source/drain stressor of a metal-oxide-semiconductor (MOS) device;
    forming an n-type source/drain region in the first and the second SiGe regions; and
    reacting at least a top portion of the second SiGe region with a metal to form a silicide, wherein a bottom portion of the second SiGe region is not reacted with the metal.

2. The method of claim 1, wherein the second atomic percentage and the first atomic percentage have a difference greater than about five atomic percent.

3. The method of claim 1, wherein the steps of forming the first and the second SiGe regions comprise:
    recessing a portion of the semiconductor substrate to form a recess; and
    epitaxially growing the first and the second SiGe regions from the recess.

4. The method of claim 1, wherein the second SiGe region is formed in-situ with the first SiGe region, and wherein a flow of a germanium-containing precursor for forming the second SiGe region is reduced over a flow of the germanium-containing precursor for forming the first SiGe region.

5. The method of claim 1, wherein the first SiGe region comprises a horizontal portion and a vertical portion over the horizontal portion, and the second SiGe region comprises:
    a bottom surface contacting a top surface of the horizontal portion of the first SiGe region; and
    a side edge contacting a side edge of the vertical portion of the first SiGe region.

6. The method of claim 5 further comprising:
    before the steps of forming the first and the second SiGe regions, forming a dummy spacer on a sidewall of the gate stack;
    after the steps of forming the first and the second SiGe regions, removing the dummy spacer; and
    after the step of removing the dummy spacer, forming a gate spacer on the sidewall of the gate stack, wherein the gate spacer is thicker than the dummy spacer.

7. A method comprising:
    forming a gate stack over a semiconductor substrate;
    forming a dummy spacer on a sidewall of the gate stack;
    forming a recess in the semiconductor substrate and adjacent the dummy spacer;
    forming a SiGe region having at least a portion in the recess comprising:
        epitaxially growing a first portion of the SiGe region in the recess and covering a bottom and a sidewall of the recess, wherein the first portion has a first atomic percentage of germanium to germanium and silicon; and
        epitaxially growing a second portion of the SiGe region in a remaining portion of the recess, wherein the second portion has a second atomic percentage of germanium to germanium and silicon, and wherein the second atomic percentage is lower than the first atomic percentage;
    removing the dummy spacer;
    forming a gate spacer on the sidewall of the gate stack;
    performing an implantation to form a source/drain region in the SiGe region, wherein the source/drain region is of n-type; and
    reacting at least a top portion of the second portion of the SiGe region with a metal to form a silicide, wherein the first portion of the SiGe region does not form silicide with the metal, and wherein the second portion of the SiGe region is fully consumed in the step of reacting.

8. The method of claim 7 further comprising forming a lightly doped source/drain region after the step of removing the dummy spacer and before the step of forming the gate spacer.

9. The method of claim 8, wherein the gate spacer has a thickness greater than a thickness of the dummy spacer.

10. The method of claim 7, wherein the first and the second atomic percentages have a difference greater than about five atomic percent.

11. The method of claim 7, wherein the gate spacer has an outer edge substantially aligned with a vertical interface between the first portion and the second portion of the SiGe region.

* * * * *